United States Patent
Tsironis (10) Patent No.: US 10,168,362 B1
(45) Date of Patent: Jan. 1, 2019

(54) ACTIVE SLIDE SCREW TUNER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 90 days.

(21) Appl. No.: 15/480,876

(22) Filed: Apr. 6, 2017

Related U.S. Application Data (60) Provisional application No. 62/318,996, filed on Apr. 6, 2016.

(51) Int. Cl.
| | |
|---|---|
| *G01R 27/32* | (2006.01) |
| *H03H 7/38* | (2006.01) |
| *G01R 17/02* | (2006.01) |
| *G01R 31/26* | (2014.01) |
| *H03H 7/40* | (2006.01) |

(52) U.S. Cl.
CPC ......... *G01R 17/02* (2013.01); *G01R 31/2607* (2013.01); *H03H 7/40* (2013.01)

(58) Field of Classification Search
CPC .. G01R 31/319; G01R 31/2822; G01R 27/28; H03H 7/38; H03H 7/40
USPC .................................... 333/263, 17.3, 32, 33
See application file for complete search history.

(56) References Cited

U.S. PATENT DOCUMENTS

| | | | |
|---|---|---|---|
| 7,282,926 B1 | 10/2007 | Verspecht et al. | |
| 9,331,670 B1 | 5/2016 | Mahmoudi et al. | |
| 9,960,472 B1 * | 5/2018 | Tsironis | H01P 5/04 |

OTHER PUBLICATIONS

A New Load-pull Characterization Method for Microwave Power Transistors, Y. Takayama, [online], 1976 IEEE Microwave Theory & Techniques Society (MTT-S) International Microwave Symposium, pp. 218-220. [Retrieved on Apr. 6, 2017]. Retrieved from Internet <URL: http://ieeexplore.ieee.org/document/1123701/>.
"Active Load Pull System, ALPS", Product Note 33, Focus Microwaves, Apr. 1966, p. 3, Figure 3.
"Computer-Aided Error Correction of Large- Signal Load-Pull Measurements", Tucker, R.S. and BR Adley P., [online], IEEE Transactions on Microwave Theory and Techniques, vol. MTT-32, No. 3, Mar. 1984, pp. 296-300. [Retrieved Apr. 6, 2017]. Retrieved from Internet <URL: http://ieeexplore.ieee.org/document/1132668/>.
"Comparison of Active Versus Passive On-wafer Load-pull Characterization of Microwave and Millimeter-wave Power Devices," J. E. Muller and B. Gyselinckx,[online],1994 IEEE MTT-S Digest, CH3389-4/94/0000-1007$01.00, pp. 1007-1080, Figure 1, [Retrieved Apr. 6, 2017]. Retrieved from Internet < URL: http://ieeexplore.ieee.org/el5/1100/7886/00335168.pdf>.
Multi Port Measurements, presentation by, D. Blackham and K.Wong, Agilent Technologies. pp. 3-8.

* cited by examiner

*Primary Examiner* — Stephen E. Jones (57) ABSTRACT

An active slide screw tuner uses the forward injection technique, also called Gamma Boosting Unit (GBU) cascaded with a passive impedance tuner in the same slabline and housing. The GBU samples a portion of the forward travelling signal, adjusts its phase, amplifies it, adjusts its amplitude (attenuation) and couples it back, in reverse direction into the main signal path. In the present active tuner technique as is herein implemented, the horizontal and vertical movement of the forward coupler through remote control in a tuner-type carriage and vertical axis, eliminates the need of a separated phase shifter and attenuator, which makes the solution better, simpler and more effective.

11 Claims, 12 Drawing Sheets

FIG. 6 (see FIG. 3)

ACTIVE SLIDE SCREW TUNER

PRIORITY CLAIM

This application claims priority on provisional application 62/318,996, titled "Active Slide Screw Tuner", filed on 6$^{th}$ of Apr. 2016.

CROSS-REFERENCE TO RELATED ARTICLES

1. "A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on 2017 Apr. 6]. Retrieved from Internet <URL: http://ieeexplore.ieee.org/document/1123701/>.
2. "Active Load Pull System, ALPS", Product Note 33, Focus Microwaves, April 1966, page 3, FIG. 3.
3. "Computer-Aided Error Correction of Large-Signal Load-Pull Measurements", TUCKER, R. S. and BRADLEY P., [online], IEEE Transactions on Microwave Theory and Techniques, vol. MTT-32, No. 3, March 1984, pp. 296-300. [Retrieved 2017-04-06]. Retrieved from Internet <URL: http://ieeexplore.ieee.org/document/1132668/>.
4. "Comparison of Active Versus Passive On-wafer Load-pull Characterization of Microwave and Millimeter-wave Power Devices," J. E. Muller and B. Gyselinckx, [online], 1994 IEEE MTT-S Digest, CH3389-4/94/0000-1007$01.00, pp 1007-1080, FIG. 1, [Retrieved 2017-04-06]. Retrieved from Internet <URL: http://ieeexplore.ieee.org/iel5/1100/7886/00335168.pdf>.
5. Mahmoudi, et al. U.S. Pat. No. 9,331,670, "Gamma Boosting Unit (GBU) for Hybrid Load and Source Pull".
6. "Multi Port Measurements", presentation by, D. Blackham and K. Wong, Agilent Technologies. Pages 3-8.
7. Verspecht, et al., U.S. Pat. No. 7,282,926, "Method and an apparatus for characterizing a high-frequency device-under-test in a large signal impedance tuning environment".

BACKGROUND OF THE INVENTION

This invention relates to high power (nonlinear) testing of microwave transistors (DUT). When the transistor is driven in its nonlinear operation regime, the internal impedance at the output of power transistors is very low. An impedance tuner used to match the transistor must also physically match such impedance. Passive impedance tuners can reach maximum reflection factors $|\Gamma_{tuner}|$ of the order of 0.95, corresponding to impedances of 2.4 Ohm at their test port reference plane. The insertion loss between DUT and tuner reduces the available tuning range at the DUT reference plane and thus the capacity of the passive tuner to match the transistor. The only remedy to this limitation is using active systems, i.e. test systems whereby a signal coherent (synchronous) with the signal injected into the transistor, is injected independently into the DUT output terminal and creates a virtual load. This additional signal can be the only one injected, in which case we speak of "active" load pull, or it can be superimposed (vector-added) to signal reflected by a passive tuner, in which case we speak of "hybrid" load pull; obviously if only a tuner is present, we speak of "passive" load pull. In both active injection cases the objective is reaching and matching the conjugate complex internal impedance of the transistor; in general terms a standard requirement is a dynamic range reaching a reflection factor $|\Gamma|=1$ (corresponding to an internal impedance real part of 0 Ohm). The objective of this invention is an active tuner apparatus, combining a forward signal injection mechanism within a tuner architecture, allowing $|\Gamma|=1$.

DESCRIPTION OF PRIOR ART

There have been several attempts to active load pull systems, starting back in the 70'ies (see ref. 1 to 4). Such load pull techniques use the so called "virtual load" method. The virtual load method consists in injecting into the output of the DUT RF power at the same frequency as traversing the DUT from the input to the output, but with controlled phase and amplitude. Knowing that the reflection factor "seen" by the DUT is equal to the ratio of returned (normally "reflected") power wave <a> to primary output power wave <b>: ($\Gamma$=<a>/<b>), it is understood that by controlling the phase and amplitude of <a> we can control $\Gamma$. There are a number of ways to do this: One is to use an "active load" technique (see ref. 2). In this case part of the outgoing power $P_{out}$ is split into a directional coupler, filtered, phase adjusted and amplified and re-injected into the output port of the DUT, which will "see" a complex load $\Gamma$ as described above. Another method is to use a split signal (see ref. 1) or two synchronized RF sources (see ref. 3) one to inject RF power into the input of the DUT and one into its output. Since the sources are synchronized they can generate a coherent signal and if we adjust the relative phases between sources and the amplitude of the second source, then the DUT will, again, see at its output port a "virtual" load $\Gamma$, as described earlier.

Figure 1:
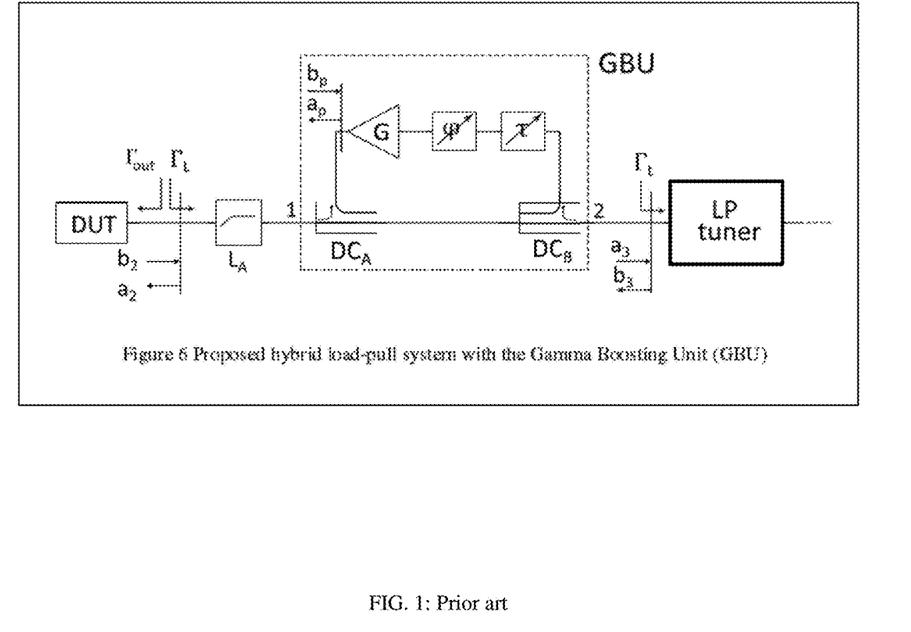
FIG. 1 depicts prior art, the Gamma Boosting Unit, a forward coupling active injection system, (see ref. 5)

The concept used in this invention is the forward injection technique, also called Gamma Boosting Unit (GBU), FIG. 1, see ref. 5. The GBU samples a portion of the forward travelling signal (port 1 in FIG. 1), adjusts its phase using a phase shifter ($\Phi$), amplifies it, adjusts its amplitude (attenuation ($\tau$)) and couples it back (port 2 in FIG. 1), in reverse direction into the main signal path. The new way this concept is realized in this invention, though, eliminates the need of both the phase shifter and the attenuator; this creates a better, simpler and more effective solution and allows integrating the active injection part with a passive impedance tuner in the same slabline with minimum interconnections, spurious multiple reflections and transition loss of the interconnections.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 2:
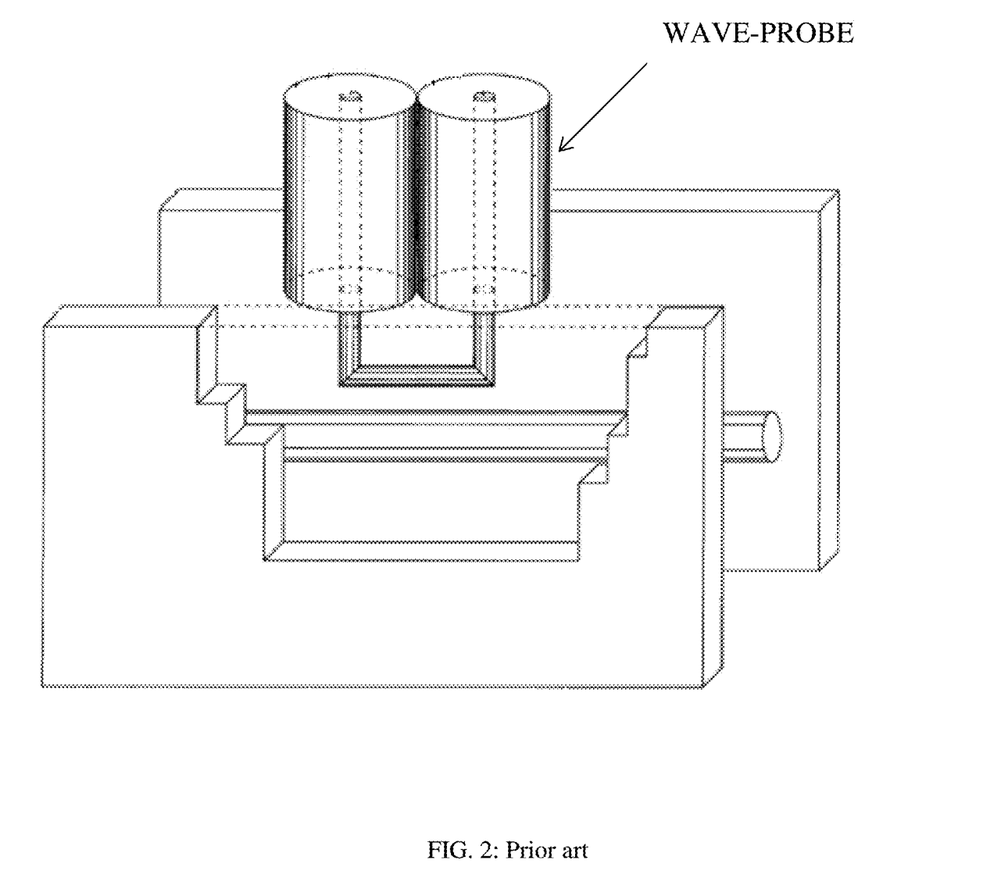
FIG. 2 depicts prior art, a compact directional signal coupler using a folded semi-rigid coaxial cable, ("waveprobe", see ref. 7).
Figure 11:
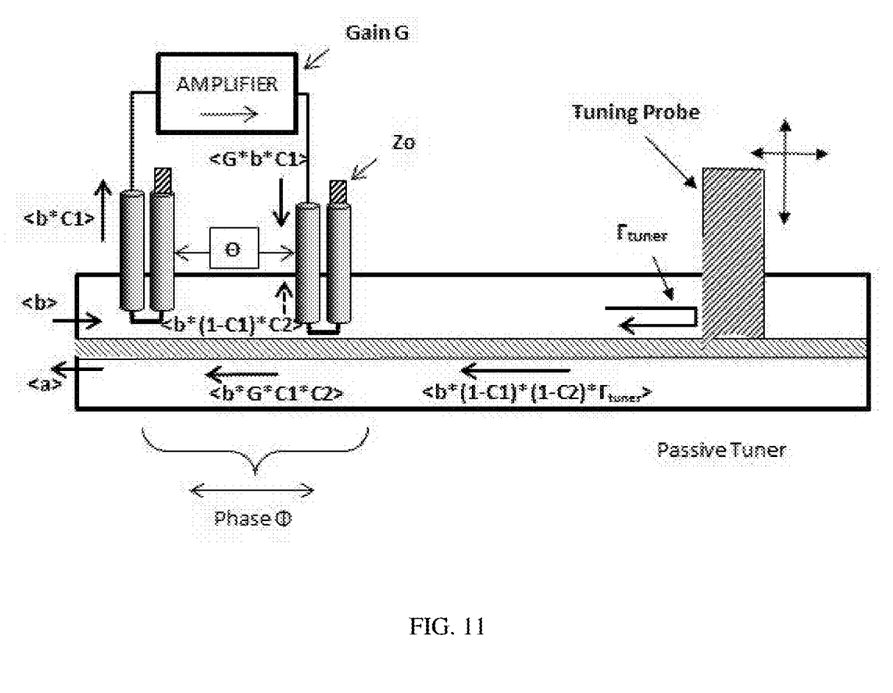
FIG. 11 depicts a schematic outline of the working principle and signal flows of the active tuner: Φ is the absolute phase of the overall active section and Θ is the relative phase between couplers.
Figure 12:
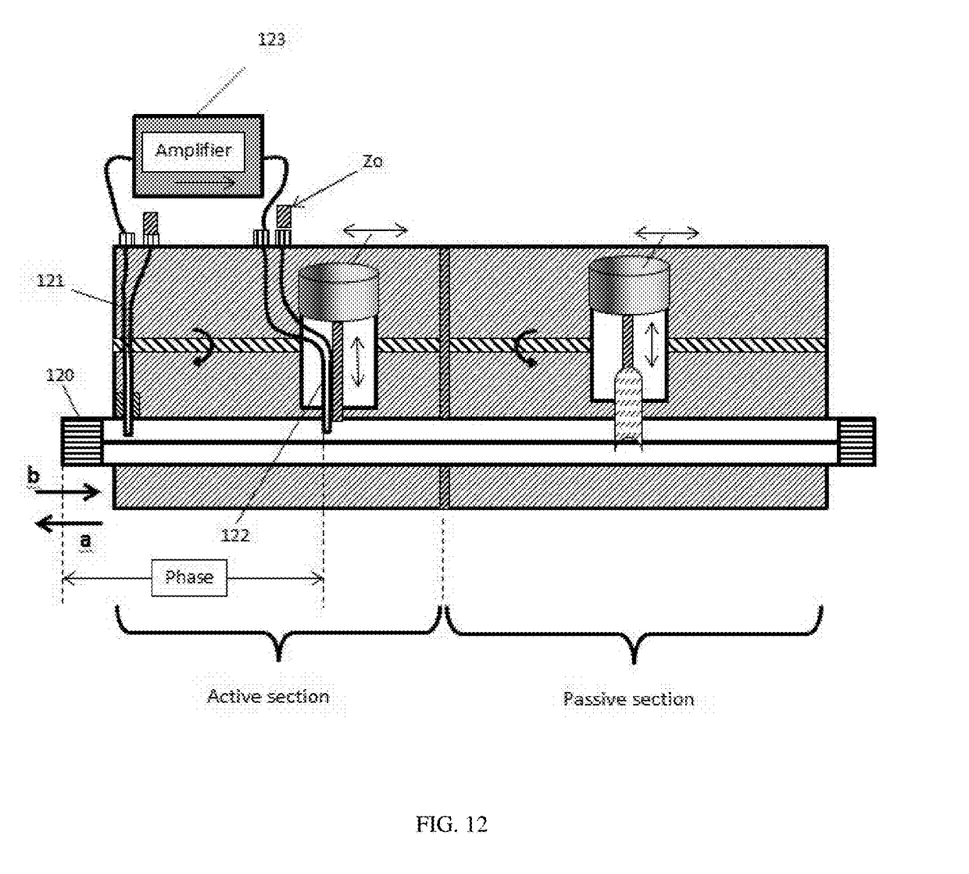
FIG. 12 depicts alternative embodiment, whereby the fixed coupler (121) is closer to the test port (120) than the variable coupler (122) and the amplifier (123) is inversed.

The concept of the hybrid slide screw tuner is shown in FIGS. 4, 5, 9 and 12, and in operational detail in FIG. 11. In a single housing (45) and using the same slabline (408) there are integrated two cascaded sections: the passive tuning section and the active tuning section; the passive tuning section comprises the mobile carriage (48) and the vertical motor (49) which controls the precision vertical axis (47); the vertical axis (47) has a metallic reflective tuning probe (46) attached to its lower end; the probe (46) is aligned inside the slabline (408) and is coupled capacitively with the center conductor (44); moving the probe (46) up and down controls the amplitude of the passive part of the reflection factor presented at the test port (40) and moving the carriage (48) along the slabline (408) controls the phase of the reflection factor. The two carriages (48) and (403) move independently, the driving screw (400) being divided in two independently rotating sections by a vertical support wall (409), since the passive tuning and the active signal injection (active tuning) must be independent. Depending on the amplifier (see FIG. 8) and coupling factors and frequency response used and to avoid undesired signal overlapping and resonances, the frequency band of the active section can be limited either by selecting proper amplifiers, couplers or by adding low-pass, high-pass or pass-band filters in the active section in front or behind the amplifier (see FIG. 8). The carriages and their vertical axes are remotely adjusted by lead screws and other suitable gear, driven by electrical (stepper) motors, which are controlled electronically using control boards, processors and appropriate control software. FIG. 6 depicts forward and reverse (directivity) coupling of a short signal coupler as in FIG. 2 (also called wave-probe, see ref. 7). The difference of over 10 dB for a simple uncompensated structure shows the utility of the application. The coupling factor itself is adjustable by setting the distance between center conductor (55) and coupler, through vertical movement of the vertical axis (42, 52). This allows adjusting the attenuation of the amplifier loop.

FIG. 11 outlines, schematically, the major power wave flow and interactions. Wave <b> comes out of the DUT output port. Part of it, <b*C1>, is coupled, through the coupling factor C1 of the first coupler, into the amplifier. All coupling factors C are <1. The amplifier amplifies the coupled signal and delivers <b*C1*G>, whereby G is the gain of the amplifier. This power wave (signal) is coupled back into the slabline main axis, through the coupling factor C2 of the second coupler, resulting in a power wave towards the DUT of <b*C1*G*C2>. The remaining signal power from the original <b> i.e. <b*(1−C1)> propagates towards the passive tuner after losing the part <b*(1−C1)*C2> of its strength into the second coupler; the passive tuner creates a reflection factor $\Gamma_{tuner}$. The remaining signal <b*(1−C1)* (1−C2)> is reflected by the tuner going back towards the DUT as: <b*(1−C1)*(1−C2) $\Gamma_{tuner}$>; this returning signal overlaps with the backwards injected signal <b*G*C1*C2> and creates a total returning signal wave <a>=<b* (G*C1*C2+(1−C1)*(1−C2)*$\Gamma_{tuner}$)>. The total reflection at the DUT port is $\Gamma_{load}$=<a>/<b>=G*C1*C2+(1−C1)*(1−C2) *$\Gamma_{tuner}$. Depending on C1, C2, G and the associated vector phases, this value can be equal or higher than 1. Assuming C1=0.1, C2=0.3 this requires the gain of the amplifier needed for this $\Gamma_{load}$ factor to reach 1 is 53 or 17.2 dB. Allowing for losses and leaks, an, easily to obtain, amplifier with a gain of 25 to 30 dB will allow a successful operation. This calculation assumes the phase Φ to be adjusted for the returning power waves to be in phase with the reflected signal at the tuner. An advantage of the hereby presented solution is that this phase Φ can be adjusted continuously and independently of the passive tuner reflection phase in order for the combined wave vectors at the test port, to match the optimum device conjugate impedance at the DUT reference plane by allowing reaching very high Gamma values, independently on the system, couplers, transmission lines etc. (unavoidable) leaks and losses. The phase Θ between the couplers shall not allow cancelling the forward <G*b*C1> and backward <b*(1−C1)*C2> waves coupled into coupler #2. This requires a fine, frequency dependent, adjustment of the distance between the couplers and/or the leading cables to and from the amplifier.

Figure 4:
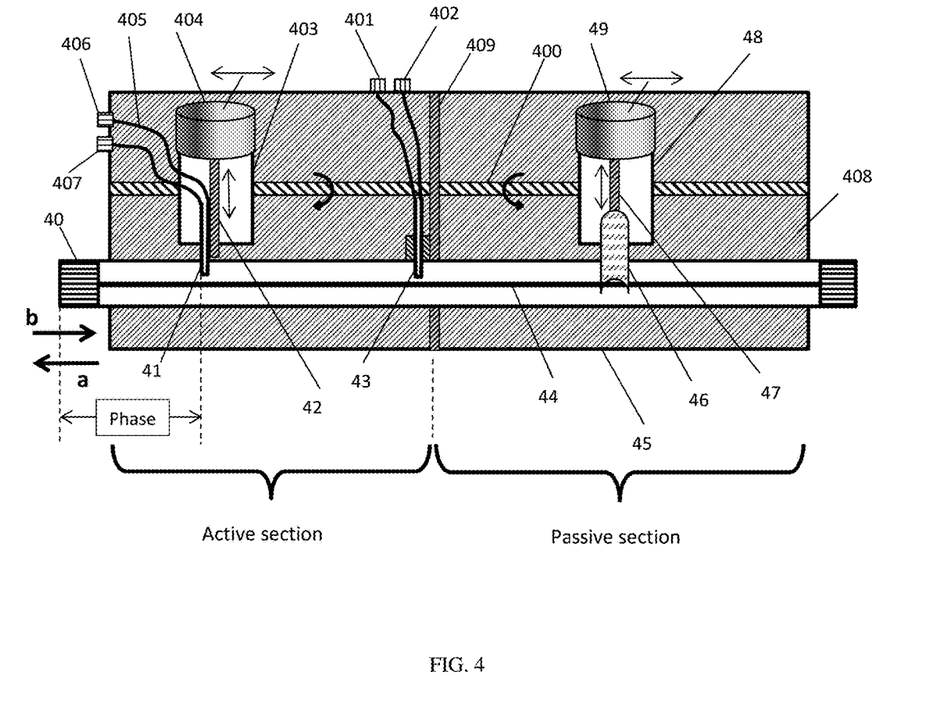
FIG. 4 depicts front view of a hybrid (active plus passive) slide screw tuner comprising a gamma boosting active section and a passive tuning section and only one mobile coupler (41).
Figure 5:
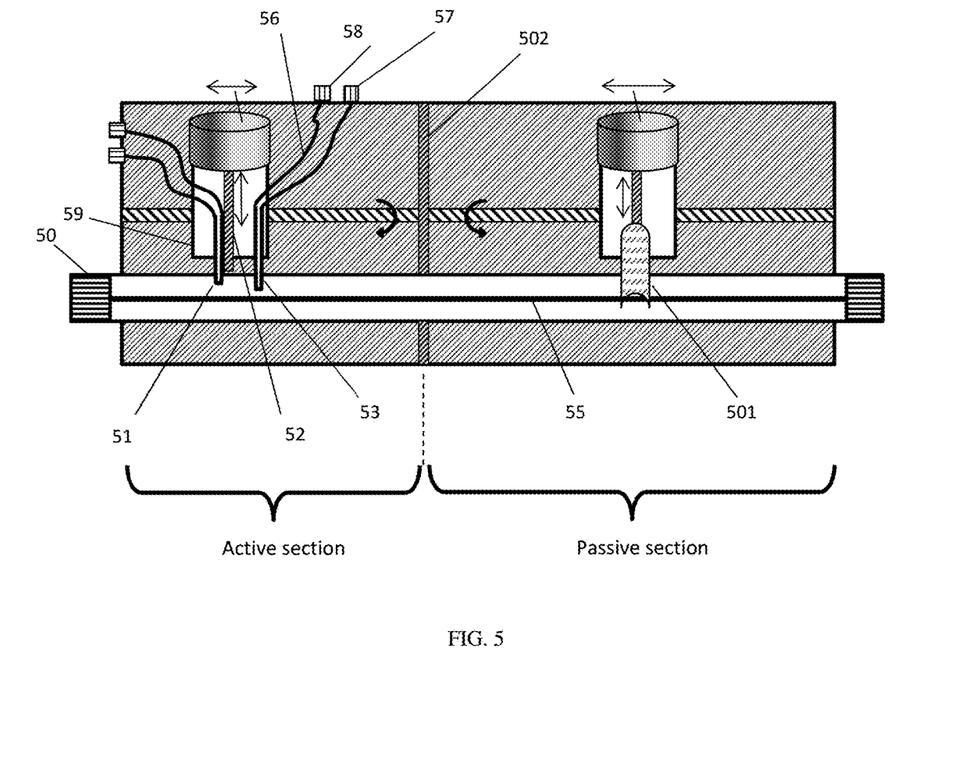
FIG. 5 depicts front view of alternative configuration of hybrid slide screw tuner, with both couplers mobile, one (51) horizontally and vertically and the other (53) horizontally only.
Figure 6:
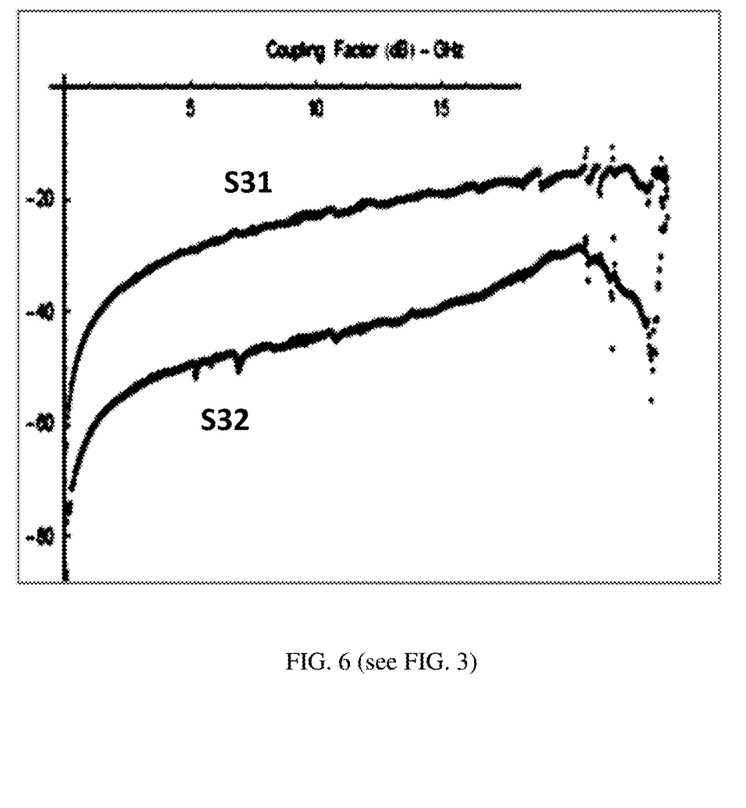
FIG. 6 depicts measurement of forward and reverse coupling of a signal coupler (wave-probe) as depicted in FIG. 2, as a function of frequency; s-parameter definitions are as defined in FIG. 3.
Figure 7:
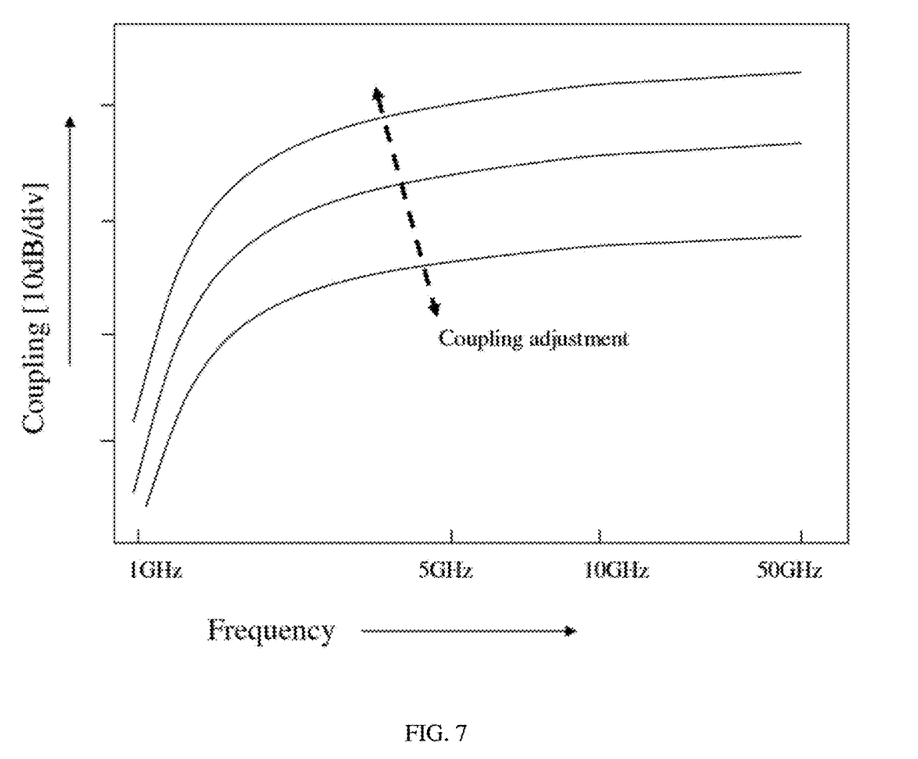
FIG. 7 depicts variation of coupling factor as a function of proximity of coupler to center conductor (probe depth) and frequency.

The active section of the hybrid tuner is located entirely between the passive tuning section and the test port (FIGS. 4 and 5). The DUT is always connected to the test port. The tuning part of the active section comprises (i) a fixed coupler (43) and (ii) a mobile coupler (41); the fixed coupler comprises the coupling loop itself (43) and the coupled (401) and isolated (402) ports; these two ports are mounted on the tuner housing and are connected with the coupler itself using coaxial cables. The coupler (43) is mounted permanently on the slabline (408) and the coupling loop is placed in such a distance from the test port (40) as to allow the tuning probe (46) to travel horizontally at least one half of a wavelength at the lowest frequency of operation, along the slabline (408), to cover 360 degrees of passive reflection factor phase.

Figure 3:
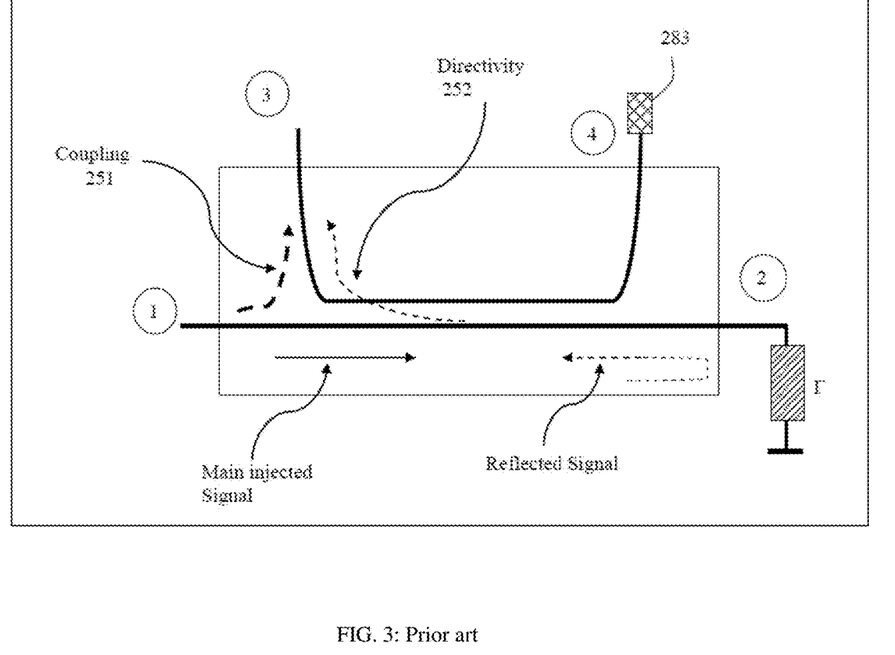
FIG. 3 depicts prior art, signal flow definitions in a directional coupler.

The mobile coupler (41) of the active section is mounted on vertical axis (42) of the mobile carriage (403), and comprises flexible access cables (405), which lead to coupled port connector (407) and isolated port connector (406), both attached to the tuner housing (45). Each directional coupler has a forward coupling port (path (251) from port 1 to port 3 in FIG. 3) and an isolated port (path (283), from port 1 to port 4 in FIG. 3). The coaxial cables (405) must be flexible enough to allow for effortless horizontal movement of the carriage (403). The mobile coupler carriage (403) is of similar structure as the tuning carriage (48)

having also a vertical motor (404) and vertical axis (42). Horizontal travel of carriage (403) is, ideally, twice as large as the travel of carriage (48), to allow full angle coverage of the injected signal, since the active tuner operates in transmission and not in reflection. If this is unfeasible, because of mechanical limitations, the reflection factor Γ will not reach 1 in certain areas of the Smith chart.

Figure 8:
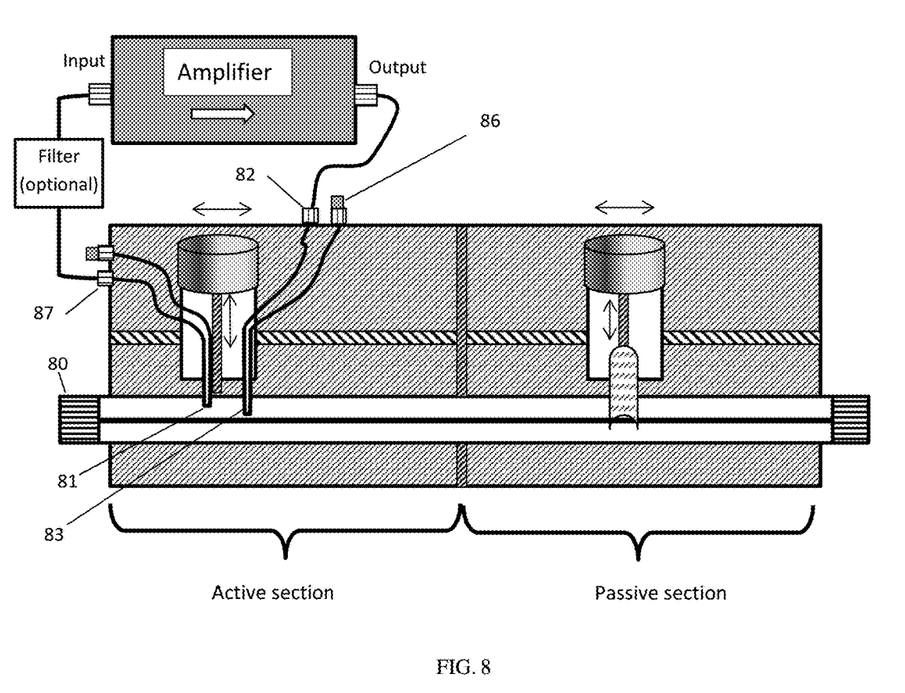
FIG. 8 depicts a complete hybrid (active plus passive) slide screw tuner, comprising the passive tuning section and the active tuning section, which comprises the couplers and the amplifier.

The way the system works is that signal entering at the test port (80) is sampled by the forward coupling branch of coupler (81) and injected into and external amplifier via port (87), see FIG. 8. The isolated coupling branch is terminated with the characteristic impedance (Zo, typically 50 Ohms) at port (86). The output port of the external amplifier is connected to the forward coupling branch of coupler (83) at port (82). The active injection concept works the same also in the reverse direction, i.e. the amplifier input port is connected to port (86) and the output port to port (87) and port (82) is terminated. In that case the signal reflected at the passive tuner will be sampled by coupler (83), amplified and injected back into the test port (80) via the coupling branch of coupler (81).

Alternatively the positions of the mobile coupler (122) and the fixed coupler (121) can be installed inversed from before relative to the test port (120). In that case, of course the fixed coupler (121) must be mounted on the external tuner wall, adjacent to the test port (120) in FIG. 12; the coupling port of the fixed coupler (122) must be mounted on the carriage wall facing the test port (120). In all cases the connection of the amplifier must respect the flow of the sampled-amplified and re-injected signal towards the test port and the DUT.

A further embodiment of the active section of the hybrid tuner of FIG. 4 is depicted in FIG. 5. In this case the secondary coupler (43), which is fixed on the slabline (408) in FIG. 4, is now fixed (53) on the mobile carriage (59) at statically adjustable distance from coupler (51) and moves horizontally together with the primary coupler (51) which is mounted on the vertical axis (52) the same way as in the embodiment of FIG. 4. From operational point of view there is no difference in regards to the injected signal; because what is important is the relative phase between the signal injected through the coupled branch of coupler (53) in direction to the test port (50) and the signal reflected and coming back from the tuner probe (501), and not the actual phase difference between the coupled branches of couplers (51) and (53). In the embodiment of FIG. 4 this phase is controlled through the position of coupler (41) relative to the test port (40), whereas in the embodiment of FIG. 5 the phase between the coupler (51) and the test port (50) is controlled by the movement of both couplers in unison. The carriages themselves move independently horizontally, made possible through the support wall (502) which guides the two leading screws at the separation plane between active section and tuning section. Whereas the embodiment of FIG. 5 offers a more compact solution, care must be taken that the signal coming back from the coupled branch of coupler (53) does not cancel the coupled signal into coupler (51). This is possible, because, even if the returning signal is attenuated through the directivity (252), in FIG. 3, it comes back amplified through the coupler (53) and can be of the same order of magnitude as the forward signal in the coupled branch of coupler (51). Depending on the frequency of operation the mounting of coupler (53) on the carriage shall be adjusted, or the access cables (56), leading to couple port (58) and isolated port (57) may have to be modified.

Even though the most common application of the Gamma Boosting Circuit (coupling section plus external amplifier) in FIGS. 4 and 5 is to be integrated with a tuning section to increase the passive reflection factor, the coupling section itself can be mounted and used independently as well. Even though this section is similar to an "active load" (see ref. 2) there is a key difference in that this unit does not require an attenuator and a phase shifter in series with the amplifier, since both functions are performed by the vertical and horizontal movement of the carriage and the vertical axis.

Figure 9:
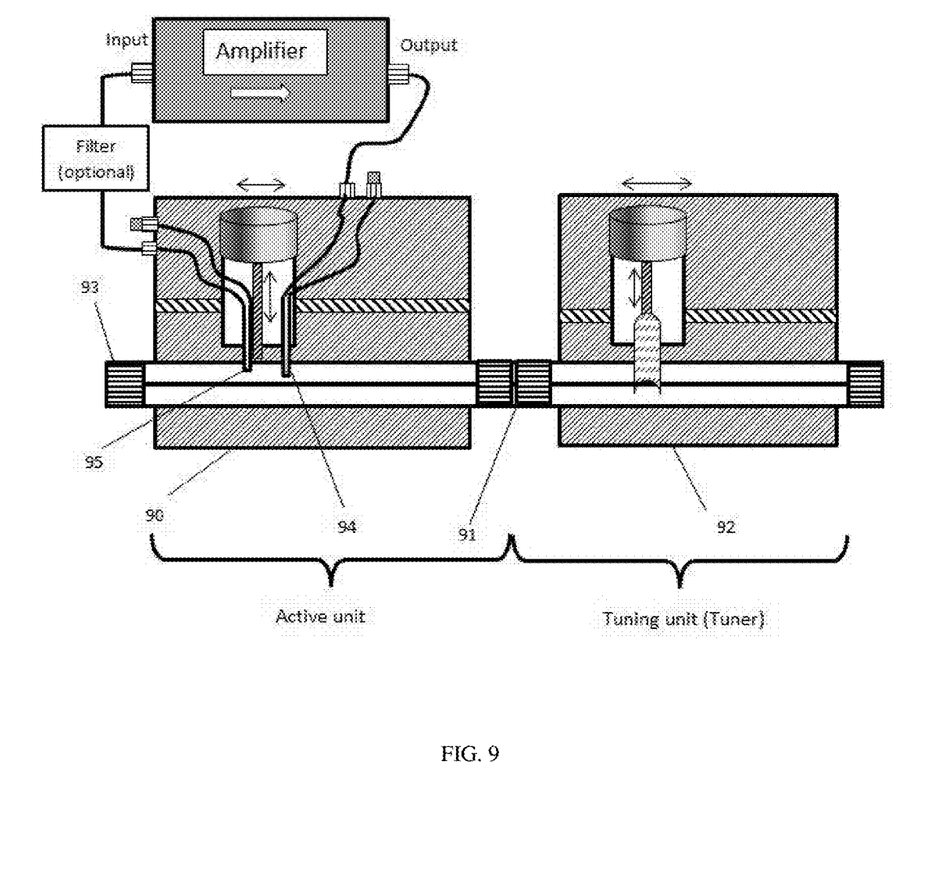
FIG. 9 depicts a physical separation of the hybrid tuner in an active tuning section comprising the first carriage, the couplers and the amplifier and a passive tuning section comprising the second carriage and the tuning probe.

Although the invention has been disclosed as an integrated device, comprising an active section and a passive section (FIG. 8), their individual operation is independent. The active section can be separated from the passive section (92) and housed in a separate enclosure (90), as shown in FIG. 9. The active section unit then comprises the fixed (94) and the variable (95) coupler, a test port (93), the amplifier and optional filter. It is connected to the passive section unit using coaxial interconnection (91). The advantage of this configuration is that the active unit can be added to existing passive tuner units to enhance their tuning range; the disadvantage is the additional insertion loss and spurious reflections created by the interconnection (91).

Figure 10:
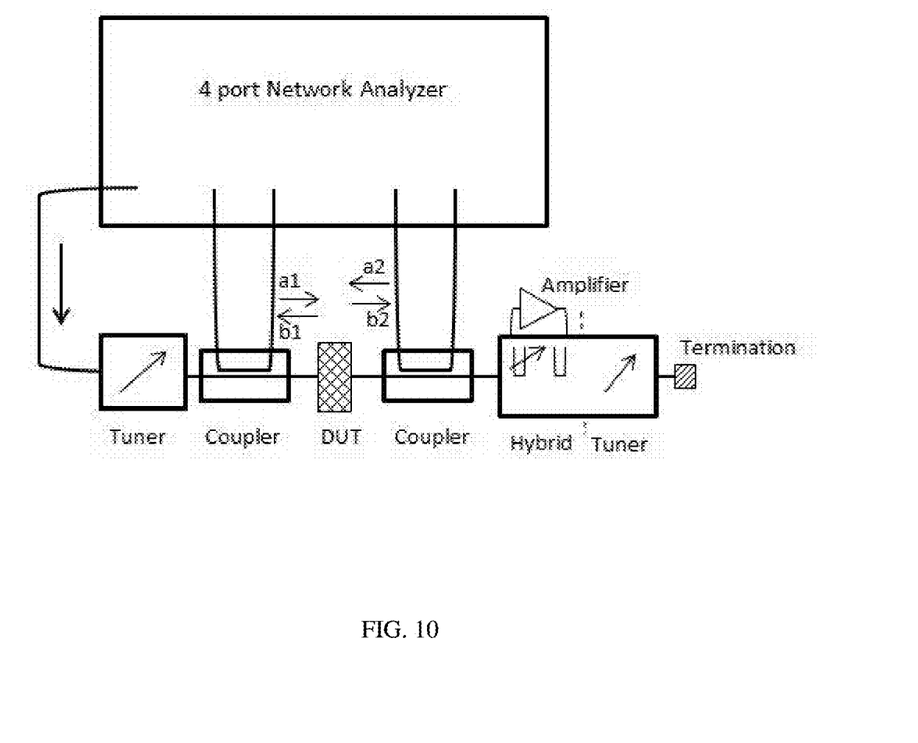
FIG. 10 depicts a load pull test setup using 4-port vector network analyzer, hybrid tuner and measurement capability of incident <a> and reflected <b> power waves at the DUT ports.

Active injection networks cannot be pre-calibrated, i.e. their s-parameters cannot be measured and used under varying test conditions. The reason is that the amplifier will become nonlinear at certain power level, causing a Gain change or a phase distortion, in which case the calibration is lost. Such networks shall be used in load pull networks with on-line wave measurement capability (see ref. 6). In this case the incident <b> and reflected <a> power waves at the test port (50), FIG. 5, are measured between DUT and test port (50) using bi-directional couplers (FIG. 10) and corrected to the DUT reference plane using setup calibration (see ref. 6).

Obvious alternative embodiments are imaginable but shall not impede on the originality of the idea of using slabline based phase and amplitude adjustable signal coupling structure to create a hybrid load pull slide screw tuner and adjustable Gamma Boosting Unit.

What I claim as my invention is:

1. An active slide screw impedance tuner, comprising
   two ports, a test port and an idle port, and a slotted low loss airline (slabline) between the ports;
   external amplifier having an input and an output port;
   characteristic impedance (Zo) terminations;
   and at least two mobile carriages, carriage #1 closest to the test port and carriage #2 closest to the idle port;
   whereby
   the carriages slide independently along the axis of the slabline and have, each, a vertically movable axis;
   and whereby
   carriage #1 has a signal coupler #1 attached on its vertical axis, which adjusts the penetration of the coupler into the slot of the slabline;
   and whereby
   a signal coupler #2 is inserted into the slot of the slabline at a fixed position between the test port and carriage #2;
   and whereby each coupler has a coupled port and an isolated port;
   and whereby the amplifier is connected to the couplers as follows:
   the input port is connected to the coupling port of coupler #1 and the output port to the coupled port of coupler #2;
   and whereby
   carriage #2 carries on its vertical axis a reflective (tuning) probe insertable to adjustable depth into the slot of the slabline and capacitively coupled with the center conductor of the slabline;

and whereby the isolated ports are terminated with characteristic impedance (Zo);

and whereby the coupling port of each coupler is close to the test port and the isolated port of each coupler is close to the idle port.

2. The tuner as in claim 1, whereby coupler #2 is inserted between carriage #1 and carriage #2.

3. The tuner as in claim 1, whereby coupler #2 is inserted between the test port and carriage #1.

4. The tuner of claim 1, whereby coupler #2 is attached to the body of carriage #1 at a fixed distance from coupler #1, which is attached to the vertical axis of carriage #1.

5. The tuner as in claims 3 or 4, whereby the position of the carriages and their axes are remotely controlled using gear, electrical motors, control electronics, digital processor and control software.

6. The tuner as in claim 5, whereby the signal couplers are wave-probes.

7. The tuner as in claim 5, being divided in two distinct tuning units:
 a) a passive tuning unit, comprising carriage #2 controlling the tuning probe, and
 b) an active tuning unit, comprising carriage #1, couplers #1 and #2 and the amplifier;

said units being mounted in separate housings, each unit having a test port and an idle port, and whereby both units are cascaded;

and whereby the test port of the active unit is the test port of the tuner.

8. The tuner as in claim 5, whereby Zo is nominally 50 Ohms.

9. The tuner as in claim 4, whereby the distance between couplers #1 and #2 is manually adjustable.

10. The tuner as in claim 1, comprising low-, high- or band-pass filter before or behind the amplifier, for limiting spurious signal generation and propagation at harmonic frequencies.

11. The tuner as in claim 7, whereby Zo is nominally 50 Ohms.

* * * * *